US006732343B2

United States Patent
Frerichs et al.

(10) Patent No.: US 6,732,343 B2
(45) Date of Patent: May 4, 2004

(54) SYSTEM AND METHODS FOR PLACING CLOCK BUFFERS IN A DATAPATH STACK

(75) Inventors: Troy Horst Frerichs, Fort Collins, CO (US); Ryan Matthew Korzyniowski, Fort Collins, CO (US); Victoria Meier, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 56 days.

(21) Appl. No.: 10/144,117

(22) Filed: May 13, 2002

(65) Prior Publication Data

US 2003/0212975 A1 Nov. 13, 2003

(51) Int. Cl.[7] ............................................. G06F 17/50
(52) U.S. Cl. ........................... 716/10; 716/1; 716/2; 716/8; 716/9; 716/12
(58) Field of Search ............... 716/10, 1–9, 12–15; 326/93

(56) References Cited

U.S. PATENT DOCUMENTS

| 5,880,607 A | * | 3/1999 | Mitra | ......................... 326/93 |
| 6,317,863 B1 | * | 11/2001 | Segal | ........................... 716/10 |
| 6,487,707 B1 | * | 11/2002 | Kamiya | .......................... 716/8 |
| 6,557,145 B2 | * | 4/2003 | Boyle et al. | ..................... 716/2 |
| 6,560,761 B1 | * | 5/2003 | Yu et al. | ........................ 716/10 |
| 6,609,238 B1 | * | 8/2003 | Tetelbaum | .................... 716/10 |
| 2002/0059553 A1 | * | 5/2002 | Eng | ................................ 716/4 |

\* cited by examiner

*Primary Examiner*—Matthew Smith
*Assistant Examiner*—Magid Y. Dimyan

(57) ABSTRACT

A clock buffer placement system and method are provided for the placement of clock buffers in a datapath stack. In accordance with one aspect of the invention, the system positions at least one track beside the datapath stack in a netlist, and identifies placement of clock buffers needed in the at least one track. Then, the system modifies the netlist by connecting at least one datapath macro to the clock buffers on the at least one track. In accordance with another aspect of the invention, a method includes positioning at least one track beside the datapath stack in a netlist, and identifying placement of clock buffers needed in the at least one track. Then, the netlist is modified by connecting at least one datapath macro to the clock buffers on the at least one track.

24 Claims, 7 Drawing Sheets

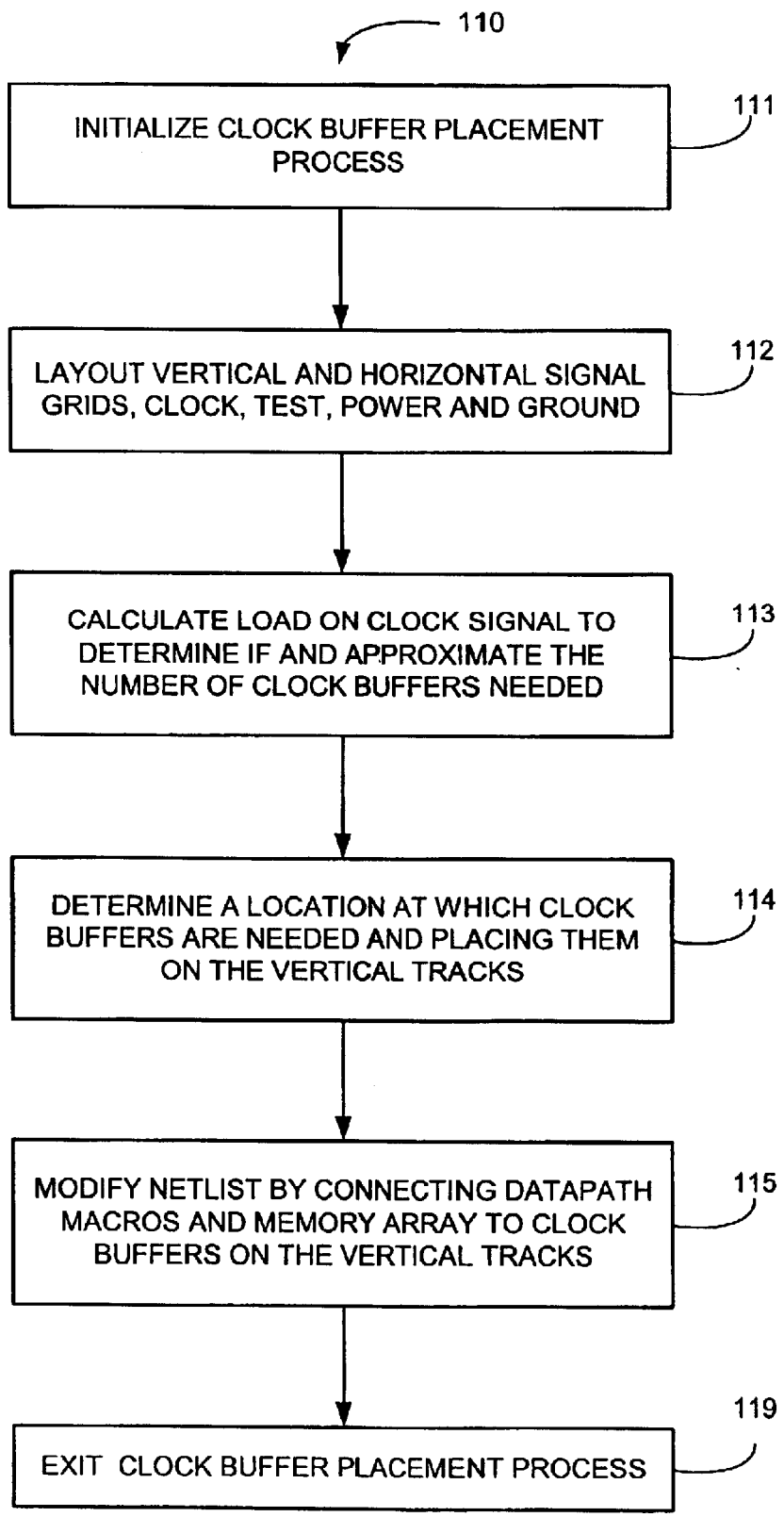

SYSTEM AND METHODS FOR PLACING CLOCK BUFFERS IN A DATAPATH STACK

BACKGROUND OF THE INVENTION

1. Field of the Invention

The present invention generally relates to computer-aided circuit design systems, and more particularly, to an electrical rules checker system and method for placing clock buffers in a datapath stack.

2. Discussion of the Related Art

Integrated circuits (ICs) are electrical circuits comprising of transistors, resistors, capacitors, and other components on a single semiconductor "chip" on which the components are interconnected to perform a variety of functions. Typical examples of ICs include, for example, microprocessors, programmable logic devices (PLDs), electrically erasable programmable read only memory (EEPROM) devices, random access memory (RAM) devices, operational amplifiers and voltage regulators. A circuit designer typically designs the IC by creating a circuit schematic indicating the electrical components and their interconnections. Often, designs are simulated by computer to verify functionality and to ensure that performance goals are satisfied.

In electrical device engineering, the design and analysis work involved in producing electronic devices is often performed using electronic computer-aided design (E-CAD) tools. As will be appreciated, electronic devices include analog, digital, mixed hardware, optical, electro-mechanical, and a variety of other electrical devices. The design and subsequent simulation of any circuit, very large scale integration (VLSI) chip, or other electrical device via E-CAD tools allows a circuit to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools utilize an electronic representation of the hardware device. A "netlist" is one common representation of a hardware device that includes the circuit. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the schematic of the circuit device.

In contrast, a hierarchical netlist will only maintain one copy of a circuit module, which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component where the inputs, outputs, and general function are known, but the contents of which are not shown. These "black box" representations, hereinafter called "modules," will mask the complexities therein, typically showing only input/output ports.

An IC design can be represented at different levels of abstraction, such as at the register-transfer level (RTL) and the at logic level, using a hardware description language (HDL). VHDL® and Verilog® are examples of HDL languages. At any abstraction level, an IC design is specified using behavioral or structural descriptions, or a mix of both. At the logical level, the behavioral description is specified using Boolean equations. The structural description is represented as a netlist of primitive cells. Examples of primitive cells are, among others, full-adders, logic gates, latches, and flip flops.

Set forth above is some very basic information regarding integrated circuits and circuit schematics that are represented in netlists. Systems are presently known that use the information provided in netlists to evaluate circuit timing and other related parameters. More specifically, systems are known that perform a timing analysis of circuits using netlist files. Although the operational specifics may vary from system to system, generally, such systems operate by identifying certain critical timing paths, then evaluating the circuit to determine whether timing violations may occur through the critical paths. As is known, timing specifications may be provided to such systems by way of a configuration file.

FIG. 1A is a block diagram illustrating a prior art static timing analyzer system that illustrates the basic informational flow in such a system and that is generally denoted by reference numeral 2. Specifically, one such system 2 is marketed under the name PathMill®. FIG. 1 illustrates the informational flow in such a system 2. At the center of the diagram is a static timing analyzer 10, (i.e., the PathMill® program). Surrounding this block 10 are a number of other blocks that represent various input and output files and/or information.

More particularly, the static timing analyzer 10 may utilize a configuration file 12, a file of timing models 14, one or more netlist file(s) 16, a technology file 18, and a parasitics file 20, for various input information. In addition, the static timing analyzer 10 may generate a number of different output files or other output information, including a critical path report 22, a runtime log file 24, an error report 26, a software interface file 28, and a SPICE netlist 30. When started, the static timing analyzer 10 first processes the input netlist file(s) 16, the technology file 18, and the configuration file 12. The information from these files is subsequently used for performing path analyses. Since the functions and operation of static timing analyzer 10 are generally well known, they need not be discussed in detail herein.

While tools such as these are useful for the design verification process after layout, there are various shortcomings in the static timing analyzer 10, and other similar products. These shortcomings include, but are not limited to, the ability to identify appropriate locations and place clock buffers in a datapath stack. Typically, the placing of clock buffers in a datapath stack involves a single trace inside of a datapath macro at a consistent location. A datapath macro is a logical representation of logic and physical characteristics of a circuit element, and a datapath stack is a collection of datapath macros. Then, a trace is applied through the datapath stack to connect to the clock. Currently, this technique is not feasible due to the size and density of large memory arrays (i.e. latch arrays) that are now incorporated in the current IC technology. A lack of space between the datapath macros and a memory array is illustrated in FIG. 1B with the datapath blocks 32 and 34 being very compressed to the memory arrays 33.

Manually placing and connecting clock buffers on the artwork to the affected signals could correct some clocking errors. However, this is extremely imprecise and labor intensive and thus, few clock buffers are placed manually. Consequently, there is a heretofore unaddressed need existing in the industry for a way to address the aforementioned deficiencies and inadequacy.

SUMMARY OF THE INVENTION

The present invention provides a clock buffer placement system and method for placing clock buffers in a datapath stack. Briefly described, in architecture, the system can be implemented as follows. The clock buffer placement system has logic that positions at least one track beside the datapath stack in a netlist, and logic that identifies the location at which a clock buffer is needed in the at least one track. Then, a logic modifies the netlist by connecting the at least one datapath macro to the clock buffer on the at least one track.

The invention can also be viewed as providing one or more methods for placing clock buffers in a datapath stack. In this regard, one such method can be summarized by the following steps: (1) positioning at least one track beside the datapath stack in a netlist; (2) identifying a location at which a clock buffer is needed in at least one track; and (3) modifying the netlist by connecting at least one datapath macro to the clock buffer on the at least one track.

DESCRIPTION OF THE DRAWINGS

The accompanying drawings incorporated in, and forming a part of the specification, illustrate several aspects of the present invention, and together with the description serve to explain the principles of the invention. In the drawings:

FIG. 6 is a flowchart illustrating one possible implementation of the method for performing the clock buffer placement process as shown in FIGS. 3 and 4, that determines a placement of clock buffers and automatically places the clock buffers in the netlist.

DETAILED DESCRIPTION OF THE PREFERRED EMBODIMENT

Having summarized various aspects of the present invention, the invention will now be described in detail with reference to the drawings. While the invention will be described in connection with these drawings, there is no intent to limit it to the embodiment or embodiments disclosed therein. On the contrary, the intent is to cover all alternatives, modifications and equivalents included within the spirit and scope of the invention as protected by the appended claims.

Figure 2:
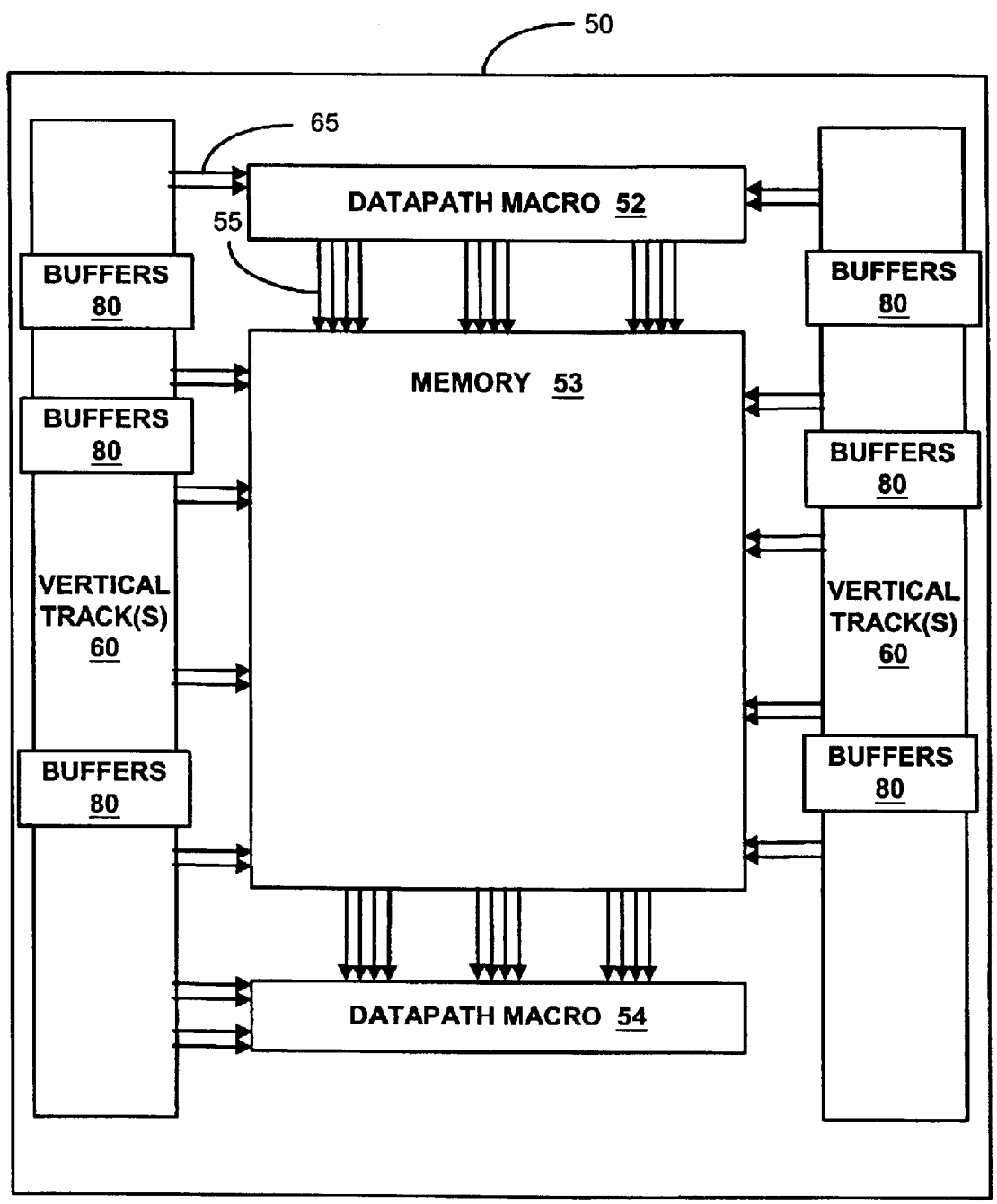
FIG. 2 is a block diagram illustrating one possible implementation of placing clock buffers alongside of the datapath macros and memory as provided by the clock buffer placement method of the present invention.

FIG. 2 is a block diagram illustrating one possible implementation of the placement of the clock buffers of the present invention. Clock buffers are placed between the datapath macros 52 and 54, and memory 53 as indicated by the clock buffer placement method of the present invention. The datapath stack 50 includes the datapath macros 52 and 54 and memory array 53 that are bracketed on either side by tracks, herein referred to as vertical tracks 60. These vertical tracks 60 include the clock buffers 80. It is understood that the datapath stack 50 is illustrated in the vertical plane, and that if the datapath stack 50 were in illustrated in a horizontal plane, then the tracks would be horizontal tracks 60.

By using the vertical tracks 60, a consistent track inside of the datapath stack 50 no longer needs to be reserved to provide a route to connect all the clock/test signals. Given that these signals are brought to the edge of datapath stack 50 and utilizing the vertical tracks 60, these signals can be located in a predetermined location. By utilizing the vertical tracks 60, it is algorithmically easier to add traces to either side of the macros in the datapath stack 50 to complete the grid. If a macro is tall, as is the memory array 53, multiple connections "lines" can be brought out to the edge of datapath stack 50 thereby reducing clock skew. Clock skew is the difference in arrival time of a clock signal between any two points. Bringing multiple lines out to the edge of the datapath stack 50 and connecting to the tracks along side (i.e. vertical tracks 60) makes it easier to make the desired connections and eliminates the need to plot the signals through a datapath macro to another datapath macro. In addition, these lines also makes it easier to calculate the capacitance of the circuitry design. Once the capacitance is calculated, it can then be determined approximately how many buffers 80 should be added before the datapath stack 50 is built.

The vertical tracks 60 are placed to either side of the datapath stack 50, and the vertical tracks 60 can be placed as a set. The datapath macros in the datapath stack 50 are then placed between the vertical tracks 60. The datapath macros are built, such that clock signals are brought out to the edge of the datapath macros 52 an 54 and the memory array 53 and extend to the vertical tracks 60. Thus, these extensions form a clock grid. At the same time, shift master (i.e. test signals), VDD and ground signals are treated in the same manner, thus forming the shift master (i.e. test signals), VDD and ground grids.

Figure 3:
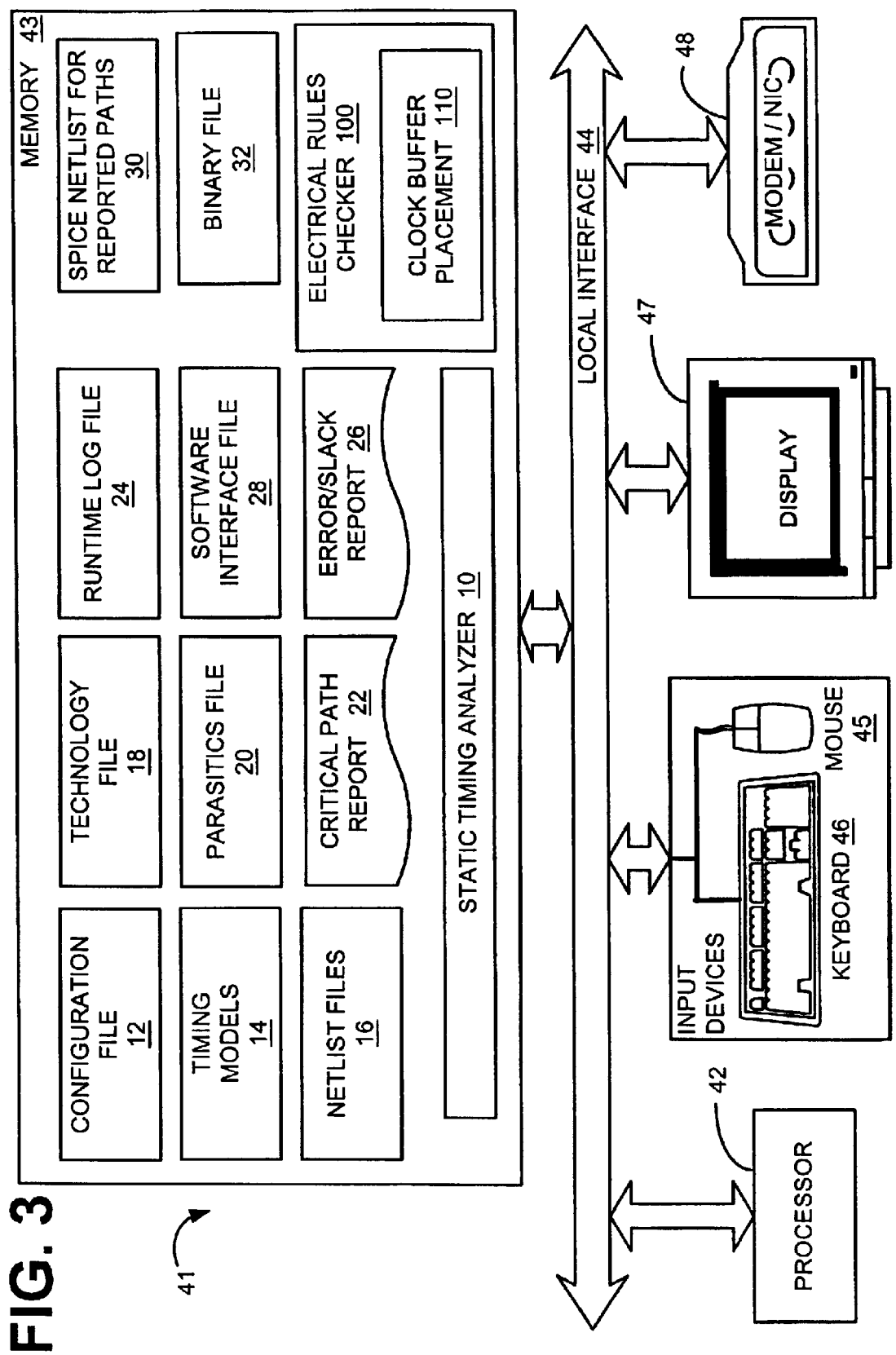
FIG. 3 is a block diagram illustrating one possible implementation of an electrical rules checker that utilizes the clock buffer placement process, situated within a computer readable medium.

FIG. 3 is a block diagram illustrating one possible implementation of an electrical rules checker 100 that utilizes the clock buffer placement process 110 of the present invention, situated within a computer readable medium. For example, the clock buffer placement process 10 can reside within a memory 43 in a general-purpose computer system 41. A general-purpose computer system can identify, access, and process resources desired by a user.

Generally, in terms of hardware architecture, as shown in FIG. 3, the computer system 41 includes a processor 42, memory 43, and one or more input devices and/or output (I/O) devices (or peripherals) that are communicatively coupled via a local interface 44. The local interface 44 can be, for example, but not limited to, one or more buses or other wired or wireless connections, as is known in the art. The local interface 44 may have additional elements, which are omitted for simplicity, such as controllers, buffers (caches), drivers, repeaters, and receivers, to enable communications. Further, the local interface 44 may include address, control, and/or data connections to enable appropriate communications among the aforementioned components.

The processor 42 is a hardware device for executing software that can be stored in memory 43. The processor 42 can be virtually any custom made or commercially available processor, a central processing unit (CPU) or an auxiliary processor among several processors associated with the computer system 41, and a semiconductor based microprocessor (in the form of a microchip) or a macroprocessor. Examples of suitable commercially available microprocessors are as follows: an 80×86 or Pentium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 43 can include any one or combination of volatile memory elements (e.g., random access memory (RAM, such as DRAM, SRAM, etc.)) and nonvolatile memory elements (e.g., ROM, hard drive, tape, CDROM, etc.). Moreover, the memory 43 may incorporate electronic, magnetic, optical, and/or other types of storage media. Note that the memory 43 can have a distributed architecture, where various components are situated remote from one another, but can be accessed by the processor 42.

The software in memory 43 may include one or more separate programs, each of which comprises an ordered listing of executable instructions for implementing logical functions. In the example of FIG. 3, the software in the memory 43 includes an operating system (not shown), configuration file 12, file of timing models 14, one or more netlist files 16, technology file 18, and a parasitics file 20, containing various input information. The critical path report 22, runtime log file 24, error report 26, software interface file 28, SPICE (i.e., a circuit simulator) netlist 30, and binary file 32 output files or other output information are also situated in memory 43. The electrical rules checker 100 and clock buffer placement process 110 are also situated in memory 43, and are herein defined in further detail with regard to FIGS. 4–6.

A non-exhaustive list of examples of suitable commercially available operating systems is as follows: a Windows operating system from Microsoft Corporation, U.S.A., a Netware operating system available from Novell, Inc., U.S.A., an operating system available from IBM, Inc., U.S.A., any LINUX operating system available from many vendors or a UNIX operating system, which is available for purchase from many vendors, such as Hewlett-Packard Company, U.S.A., Sun Microsystems, Inc. and AT&T Corporation, U.S.A. The operating system essentially controls the execution of other computer programs, such as the electrical rules checker 100 and the clock buffer placement process 110, and provides scheduling, input-output control, file and data management, memory management, and communication control and related services.

The electrical rules checker 100 that utilizes the clock buffer placement process 110 may be a source program, executable program (object code), script, or any other entity comprising a set of instructions to be performed. When a source program, then the program is usually translated via a compiler, assembler, interpreter, or the like, which may or may not be included within the memory 43, so as to operate properly in connection with the O/S. Furthermore, the electrical rules checker 100 that utilizes clock buffer placement process 110 can be written as (a) an object oriented programming language, which has classes of data and methods, or (b) a procedure programming language, which has routines, subroutines, and/or functions, for example but not limited to, C, C++, Pascal, BASIC, FORTRAN, COBOL, Perl, Java, and Ada.

The I/O devices may include input devices, for example but not limited to, a keyboard 46, mouse 45, scanner, microphone, etc. Furthermore, the I/O devices may also include output devices, for example but not limited to, a printer, display 47, etc. Finally, the I/O devices may further include devices that communicate both inputs and outputs, for instance but not limited to, a modulator/demodulator (modem; for accessing another device, system, or network) 48, a radio frequency (RF) or other transceiver, a telephonic interface, a bridge, a router, etc.

If the computer system 41 is a PC, workstation, or the like, the software in the memory 43 may further include a basic input output system (BIOS) (omitted for simplicity). The BIOS is a set of essential software routines that initialize and test hardware at startup, start-up the O/S, and support the transfer of data among the hardware devices. The BIOS is stored in ROM so that the BIOS can be executed when the computer system 41 is activated.

When the computer system 41 is in operation, the processor 42 is configured to execute software stored within the memory 43, to communicate data to and from the memory 43, and to generally control operations of the computer system 41 pursuant to the software. The electrical rules checker 100 that utilizes the clock buffer placement process 110 and the O/S are read, in whole or in part, by the processor 42, perhaps buffered within the processor 42, and then executed.

The electrical rules checker 100 can be implemented in hardware, software, firmware or a combination thereof. In the preferred embodiment, the electrical rules checker 100 and the clock buffer placement process 110 are implemented in software or firmware that is stored in a memory, such as the memory 43, and that is executed by a suitable instruction execution system, such as processor 42.

Figure 4:
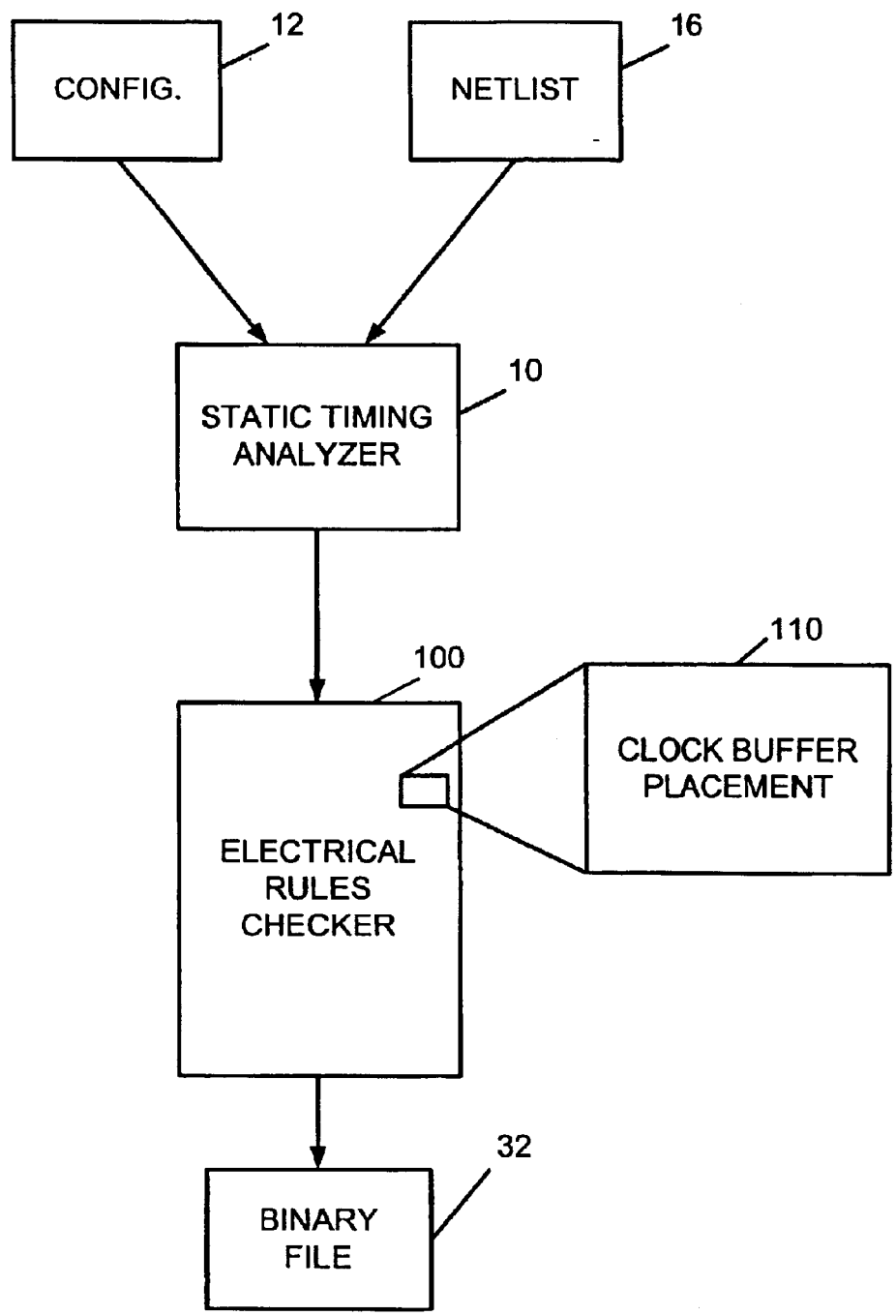
FIG. 4 is a block diagram illustrating one possible implementation of an electrical rules checker with the clock buffer placement process of the present invention, as shown in FIG. 3.
Figure 5:
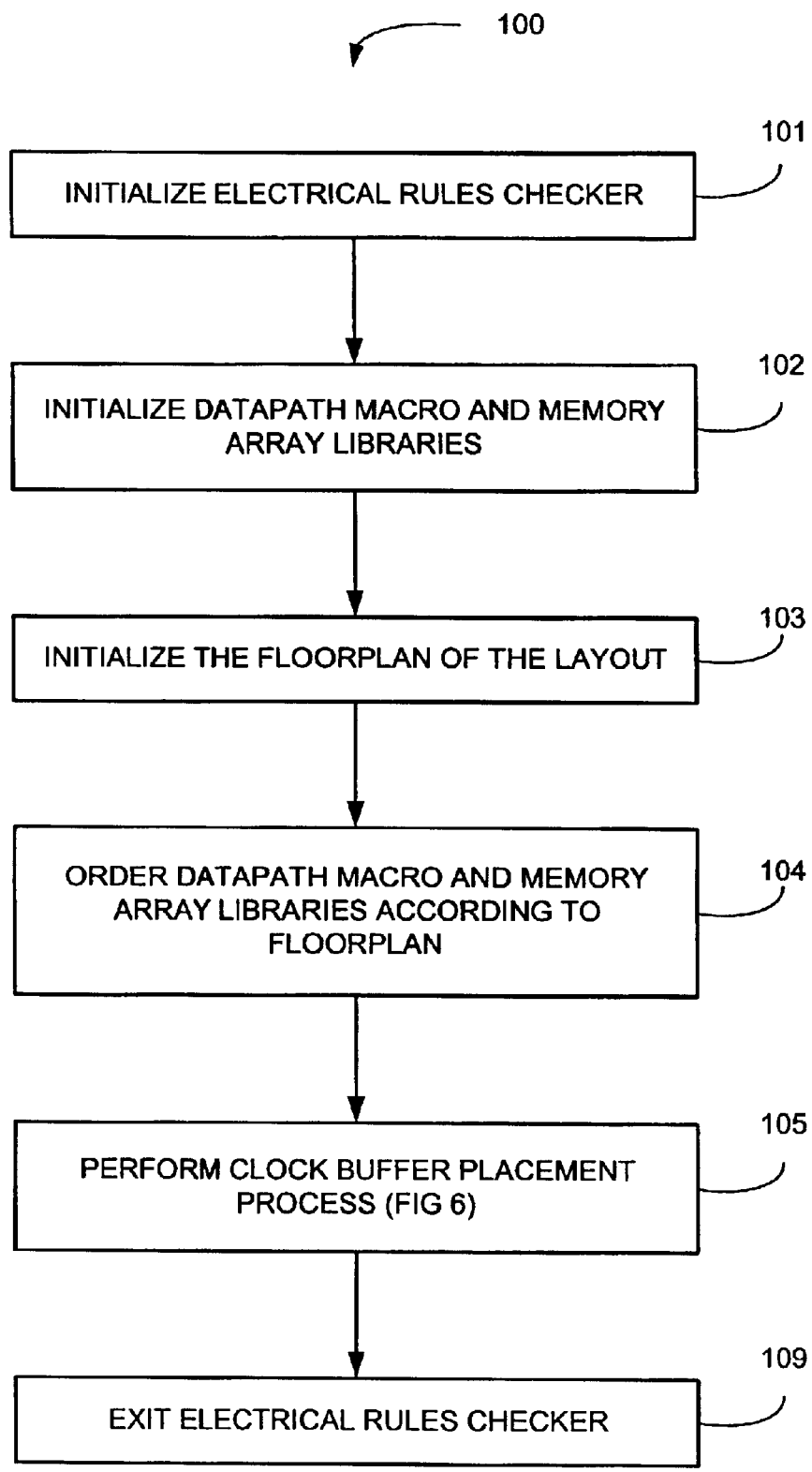
FIG. 5 is a flowchart illustrating one possible implementation of the electrical rules checker shown in FIGS. 3 and 4.

Having set forth the basic and probable circuit configurations of the various structures identified by the method of the present invention, reference is now made to FIGS. 4–6, which collectively comprise a block diagram and flow charts that illustrate the top-level functional operation of the electrical rules checker 100 and the clock buffer placement process 110 in accordance with the preferred embodiment of the present invention.

Figure 1A:
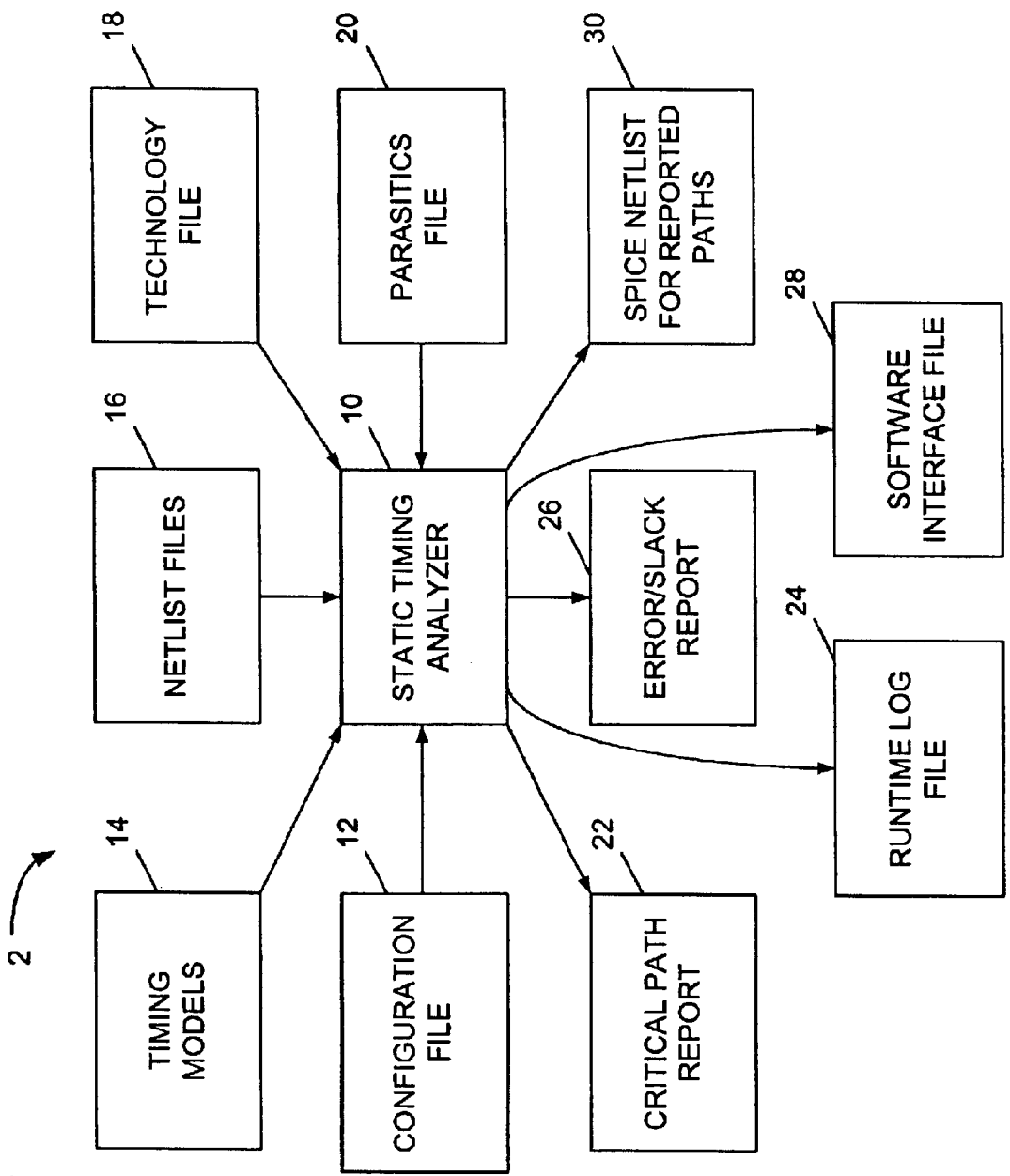
FIG. 1A is a block diagram of a static timing analyzer system, as is known in the prior art.

FIG. 4 is a block diagram illustrating one possible implementation of an electrical rules checker 100 with the clock buffer placement process 110 of the present invention. In the illustrated embodiment, only the static timing analyzer 10, the configuration file 12, and the netlist file 16 from FIG. 1A are shown. The configuration file 12 contains information that informs the static timing analyzer 10 how to perform its analysis, and various configuration files may be used. The netlist file 16, as is well known, defines the various integrated circuit components, and their connectivity. The static timing analyzer 10 may make available to the electrical rules checker 100 a binary file output 34.

The electrical rules checker 100 is preferably configured to operate on an output of the static timing analyzer 10. In this regard, the static timing analyzer may be configured to generate other output netlist files 16, which the electrical rules checker 100 then can utilize as an input. An electrical rules checker 100 performs various checks over certain rules or strategies in an integrated circuit design. Such rules may vary from circuit to circuit, depending upon the particular application.

The electrical rules checker 100 includes the preferred embodiment of the present invention, and operates to provide a method for placing clock buffers in a datapath stack 50 (FIG. 2). Normally, datapath stacks are very compactly constructed and the memory arrays are typically larger than other datapath macros, so applying a single trace inside the datapath macros is not feasible, as the trace still needs to be routed around the memory arrays. Utilizing the vertical tracks at the edge of datapath macros 52 and 54 (FIG. 2) and memory array 53 (FIG. 2) provides several advantages. First, the clock signals are brought out to the edge of the datapath stack 50, and therefore a consistent track inside of the datapath macros no longer needs to be reserved to connect clock and test signals. Given that these signals are brought to the edge and utilize the vertical tracks 60 (FIG. 2) at a known location, it is simple to add traces to either side of the datapath macros 52 and 54 or memory array 53 to complete the clock grid.

Figure 1B:
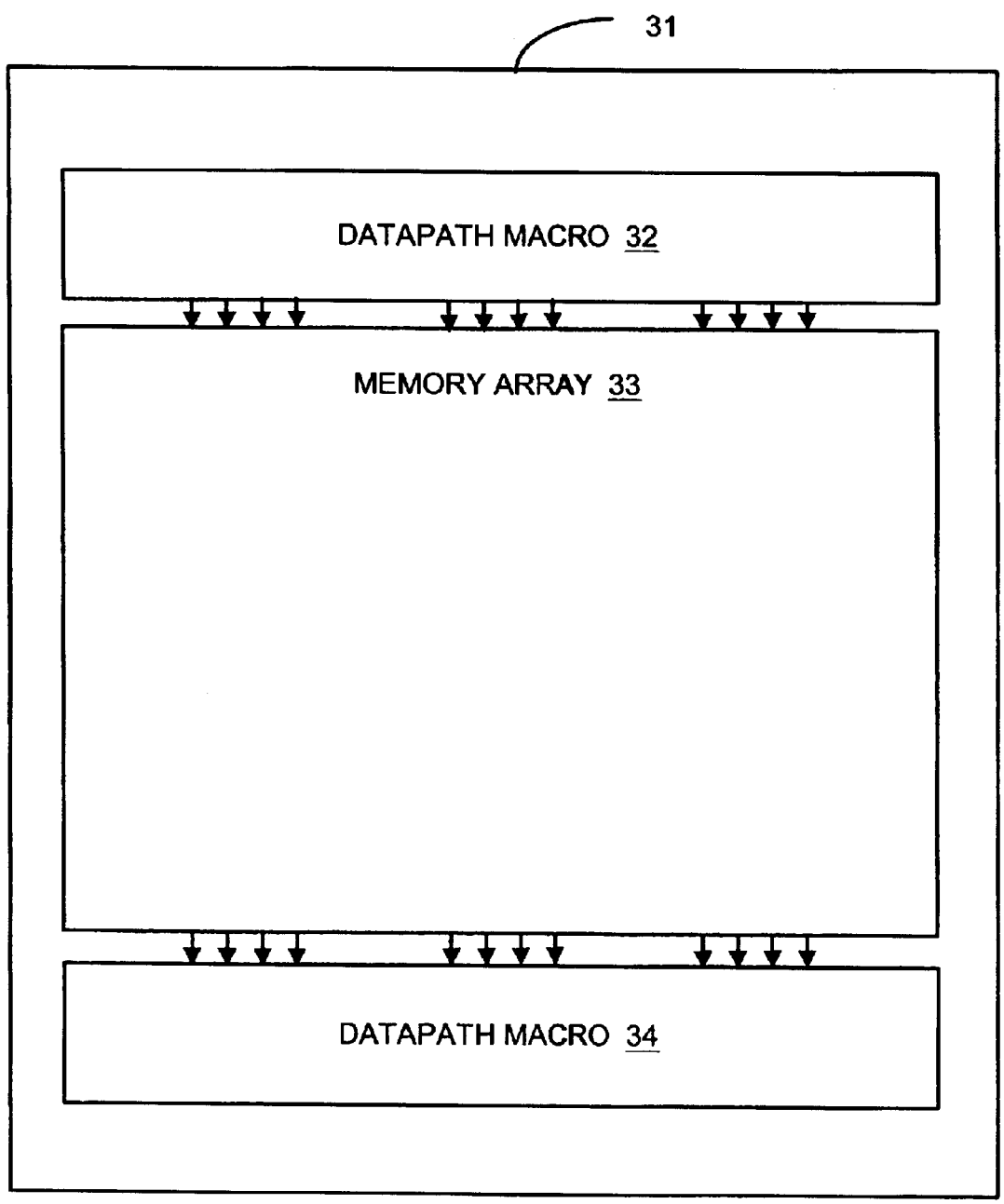
FIG. 1B is a block diagram of the connection between datapath macros and a memory, as known in the prior art.

If a datapath macro is tall, as in the case of some memory arrays 53 (FIG. 1B), multiple signal lines can be brought out to the edge of the datapath stack 50, reducing clock skew. Also, the capacitance of the datapath macros can easily be calculated, thereby identifying the approximate number of buffers needed before the datapath stack 50 (FIG. 2) is built.

A set of vertical tracks 60 (FIG. 2), can be placed on either side of the datapath stack 50 with the datapath macros 52 and 54 and the memory array 53 located between the vertical tracks 60. However, it is understood that only one vertical track 60 can be added if only one is needed. The datapath macros are built such that clock signals and other signals (i.e. test signals, VDD, ground, etc.) are brought out to the edge of the datapath stack 50 and connected to tracks 60 (FIG. 2). The signals utilizing the vertical tracks 60 thereby form a grid, such as but not limited to, a clock grid. At the same time, the shift master (i.e. test signal), VDD and ground are treated in the same manner, thus also forming grids in the vertical tracks. Once the vertical tracks are utilized, then it is possible to place the clock buffers 80 (FIG. 2) in the appropriate locations.

In an alternative embodiment, the clock buffer placement and construction of the vertical tracks 60 can be performed prior to running the static timing analyzer 10. Running the static timing analyzer 10 after constructing the clock buffers 80 on the vertical tracks 60 is performed to validate that the clock meets the design specifications, as well as to test any circuitry that may have been added for the shift master, VDD or ground signals constructed on the vertical tracks 60.

FIG. 5 is a flowchart illustrating one possible implementation of the electrical rules checker 100 with the clock buffer placement process 110 of the present invention. The electrical rules checker 100 is performed in order to verify that the current design meets clock specification and electrical migration design targets.

First, the electrical rules checker 100 is initialized at step 101. At step 102, the electrical rules checker 100 initializes the datapath macro and memory array libraries. Next, at step 103, the electrical rules checker 100 initializes a floor plan of the current circuit layout. The ordering of the datapath macro and memory array libraries is performed according to the floor plan at step 104. At step 105, the electrical rules checker 100 performs the clock buffer placement process, herein defined in further detail with regard to FIG. 6. At step 109, the electrical rules checker 100 exits.

FIG. 6 is a flowchart illustrating one possible implementation of the clock buffer placement process 110 utilized within the electrical rules checker 100. The datapath macros 52 and 54 (FIG. 2) and memory array 53 (FIG. 2) both need additional clock signals to operate. Due to the complexity and density of circuitry in current integrated circuits, it is desirable to place the additional clock signals outside of the datapath stack 50 containing the datapath macros 52 and 54 and memory array 53.

It is desirable to have these clock signals distributed in vertical tracks 60 (FIG. 2) on either side of the datapath macros 52 and 54 and memory array 53. Preferably, the clock buffers 80 (FIG. 2) and vertical tracks 60 are distributed evenly on either side of the datapath macros 52 and 54 and memory array 53. However, it is understood that unique circumstances may necessitate that there be uneven distribution of clock buffers 80 in the vertical tracks on either side of the datapath macros 52 and 54, and memory array 53. Moreover, it is also understood that it is desirable to have the clock buffers 80 evenly distributed from top to bottom of the datapath macros 52 and 54 and memory array 53. This even distribution of the clock buffers on either side of the datapath macros 52 and 54 and memory array 53 is desirable to minimize the clock transition and clock skew characteristics. In an alternative embodiment, it is possible that the memory array 53 will have clock buffer requirements difffering from the datapath macros 52 and 54 due to the operational requirements of the memory array 53.

As shown in FIG. 6, the clock buffer placement process 110 starts by initializing at step 111. At step 112, the clock buffer placement process 110 lays out the vertical and horizontal signal grids. The current illustration is shown using clock grids; however, other signal grids can be utilized. These signal grids include, but are not limited to clock test, power and ground signal grids. At step 113, the clock buffer placement process 110 calculates the load on the clock signal to determine if any, and if so, the approximate number of clock buffers 80 (FIG. 2) that are needed.

After determining if any clock buffers are needed, the clock buffer placement process 110 determines the location of any clock buffers, and places the clock buffers 80 at that location on the vertical track 60 at step 114. At step 115, the clock buffer placement process 110 then modifies the netlist by connecting the datapath macros 52 and 54 (FIG. 2) and memory arrays 53 (FIG. 2) to the clock buffers 80 (FIG. 2) on the vertical tracks. The clock buffer placement process 110 then exits at step 119.

In alternative embodiments, the technique of the placement of clock buffers 80 may be utilized for various other types of elements. These other types of elements include, but are not limited to, test signals and buffers, substrate contacts, antennas and the like.

Having described the method of the present invention, it will be appreciated that the steps illustrated in the flow charts of FIGS. 5 and 6 are provided for purposes of illustration and are not deemed to be limiting on the broader aspects of the present invention. Indeed, the broader aspects of the present invention may be implemented using a variety of different approaches that are still consistent with the scope and content of the present invention.

It should be appreciated that the flow charts of FIGS. 5 and 6 show the top-level operation of only one possible implementation of the methods of the present invention. In this regard, when implemented in software or firmware, as in the case of the preferred embodiment, each block represents a module, segment, or portion of code, which comprises one or more executable instructions for implementing the specified logical function(s). It should also be noted that in some alternative implementations, the functions noted in the blocks might occur out of the order. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for placing clock buffers in a datapath stack comprising the steps of:
    positioning at least one track beside the datapath stack in a netlist;
    identifying a location at which a clock buffer is needed in the at least one track; and
    modifying the netlist by connecting at least one datapath macro to the clock buffer on the at least one track.
2. The method as defined in claim 1, further comprising:
    connecting a test signal on the at least one track to the at least one datapath macro in the datapath stack.
3. The method as defined in claim 1, further comprising:
    calculating a number of clock buffers needed in the netlist.
4. The method as defined in claim 3, wherein the calculating step further comprises:
    calculating a load on a clock signal on the at least one datapath macro to determine the number of the clock buffers needed in the netlist.
5. The method as defined in claim 1, further comprising:
    connecting a first signal on the at least one track to the datapath stack in the netlist.
6. A system for placing clock buffers in a datapath stack comprising:
    means for positioning at least one track beside the datapath stack in a netlist;
    means for identifying a location of a clock buffer in the at least one track; and
    means for modifying the netlist by connecting at least one datapath macro to the clock buffer on the at least one track.

7. The system of claim 6, further comprising:
    means for connecting a test signal on the at least one track to the at least one datapath macro in the datapath stack.
8. The system of claim 6, further comprising:
    means for calculating a number of clock buffers needed in the netlist.
9. The system of claim 8, further comprising:
    means for calculating a load on a clock signal on the at least one datapath macro to determine the number of the clock buffers needed in the netlist.
10. The system of claim 6, further comprising:
    means for connecting a first signal on the at least one track to the datapath stack in the netlist.
11. A computer readable storage medium containing program code for placing clock buffers in a datapath stack comprising:
    a first code segment configured to position at least one track beside the datapath stack in a netlist
    a second code segment configured to identify a location at which a clock buffer is needed in the at least one track; and
    a third code segment configured to modify the netlist by connecting at least one datapath macro to the clock buffer on the at least one track.
12. The program code of claim 11, further comprising:
    a fourth code segment configured to connect a test signal on the at least one track to the at least one datapath macro in the datapath stack.
13. The program code of claim 11, wherein said second code segment is further configured to calculate a number of the clock buffers needed in the netlist.
14. The program code of claim 13, wherein said second code segment is further configured to calculate a load on a clock signal on the at least one datapath macro to determine the number of the clock buffers needed in the netlist.
15. The program code of claim 11, wherein said second code segment is further configured to connect a first signal on the at least one track to the at least one datapath macro in the datapath stack in the netlist.
16. A clock buffer placement system for placing clock buffers in a standard cell block comprising:
    logic that positions at least one track beside the datapath stack in a netlist
    logic that identifies a location at which a clock buffer is needed in the at least one track; and
    logic that modifies the netlist by connecting at least one datapath macro to the clock buffer on the at least one track.
17. The clock buffer placement system of claim 16, further comprising:
    logic that connects a test signal on the at least one track to the at least one datapath macro in the datapath stack.
18. The clock buffer placement system of claim 16, further comprising:
    logic that calculates a number of the clock buffers needed in the netlist.
19. The clock buffer placement system of claim 18, further comprising:
    logic that calculates a load on a clock signal on the at least one datapath macro to determine the number of the clock buffers needed in the netlist.
20. The clock buffer placement system of claim 16, further comprising:
    logic that connects a first signal on the at least one track to the at least one datapath macro in the datapath stack in the netlist.

21. A circuitry having clock buffers constructed by the method comprising:

positioning at least one track beside a datapath stack in a netlist;

identifying a location at which a clock buffer is needed in the at least one track; and modifying the netlist by connecting at least one datapath macro to the clock buffer on the at least one track.

22. The circuitry as defined in claim 21, further comprising:

calculating a number of clock buffers needed in the netlist.

23. The circuitry as defined in claim 21, further comprising:

calculating a load on a clock signal on the at least one datapath macro to determine the number of the clock buffers needed in the netlist.

24. The circuitry as defined in claim 23, further comprising:

connecting a second signal on the at least one track to the at least one datapath macro in the datapath stack.

* * * * *